United States Patent
Jang

(10) Patent No.: US 7,682,926 B2
(45) Date of Patent: Mar. 23, 2010

(54) SEMICONDUCTOR DEVICE AND METHOD OF FABRICATING THE SAME

(75) Inventor: Tae Su Jang, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/967,268

(22) Filed: Dec. 31, 2007

(65) Prior Publication Data
US 2009/0072342 A1      Mar. 19, 2009

(30) Foreign Application Priority Data
Sep. 18, 2007     (KR) ................. 10-2007-0094842

(51) Int. Cl.
*H01L 21/76* (2006.01)
(52) U.S. Cl. ............... 438/407; 438/162; 438/164; 257/E21.564
(58) Field of Classification Search ........... 438/162, 438/164, 407, 412, 924; 257/347, 522, 524, 257/623, E21.564
See application file for complete search history.

(56) References Cited

U.S. PATENT DOCUMENTS

| | | | |
|---|---|---|---|
| 4,925,805 A | 5/1990 | van Ommen et al. | |
| 6,277,703 B1 * | 8/2001 | Barlocchi et al. | 438/412 |
| 6,429,091 B1 * | 8/2002 | Chen et al. | 438/423 |
| 7,084,028 B2 * | 8/2006 | Fukuzumi | 438/244 |
| 7,208,780 B2 | 4/2007 | Ohsawa | |
| 7,326,644 B2 * | 2/2008 | Ito | 438/630 |
| 7,452,761 B2 * | 11/2008 | Zhu et al. | 438/155 |
| 2005/0285194 A1 | 12/2005 | Lee et al. | |
| 2006/0060921 A1 * | 3/2006 | Takizawa et al. | 257/347 |
| 2006/0278926 A1 | 12/2006 | Mathew et al. | |

* cited by examiner

*Primary Examiner*—Zandra Smith
*Assistant Examiner*—Christy L Novacek
(74) *Attorney, Agent, or Firm*—Townsend and Townsend Crew LLP

(57) ABSTRACT

A method of fabricating a semiconductor device includes forming an ion implanted region on a semiconductor substrate in a cell/core region. The semiconductor substrate is selectively etched to form a recess. The recess exposes a boundary of the ion implanted region. The ion implanted region exposed at the bottom of the recess is removed to form an under-cut space in the semiconductor substrate. An insulating film is formed to form a substrate having a silicon-on-insulator (SOI) structure in the cell/core region. The insulating film fills the under-cut space and the recess.

8 Claims, 8 Drawing Sheets

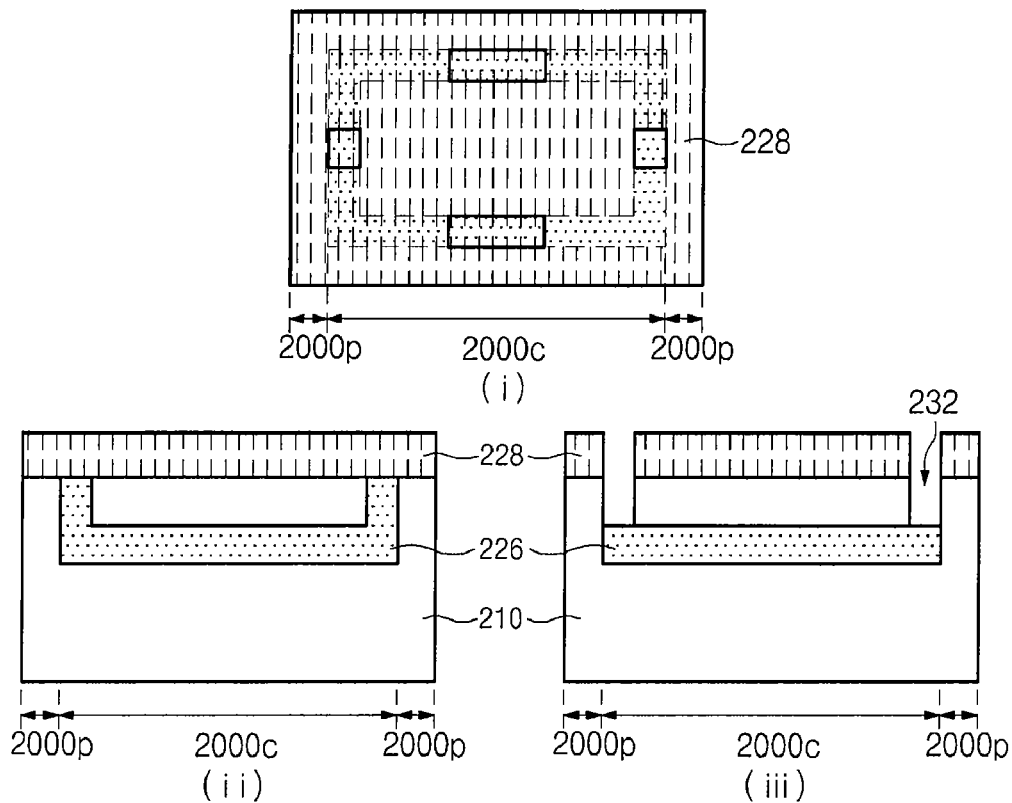
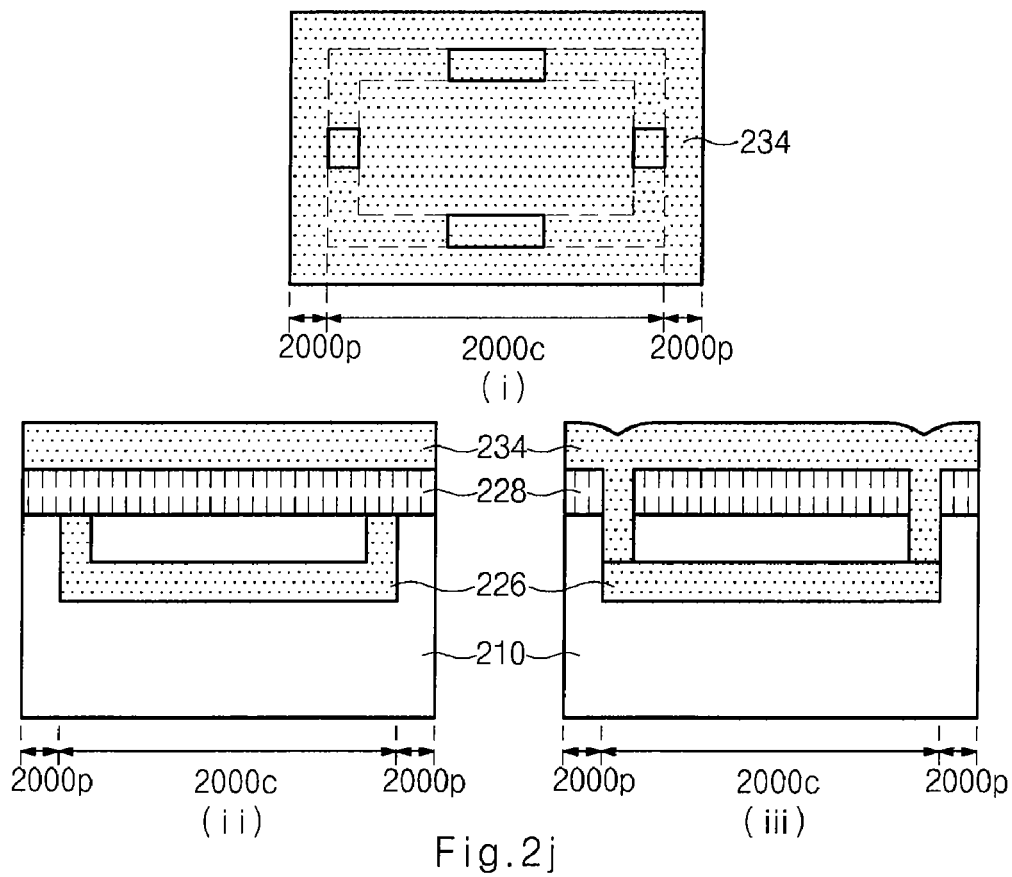
Fig.2i
Fig.2j (i)

(ii)

SEMICONDUCTOR DEVICE AND METHOD OF FABRICATING THE SAME

CROSS-REFERENCES TO RELATED APPLICATIONS

The priority of Korean patent application number 10-2007-0094842, filed on Sep. 18, 2007, which is incorporated by reference in its entirety, is claimed.

BACKGROUND OF THE INVENTION

The present invention relates to a semiconductor device. More particularly, the present invention relates to a semiconductor device having a silicon-on-insulator (SOI) structure and a method for fabricating the same.

Currently, new efforts have been made to overcome the limits of a memory cell structure containing storage capacitors, which takes up a large area of the memory device. For example, a floating body cell (FBC) structure, which eliminates the capacitor. The FBC structure utilizes a floating body effect phenomenon where a threshold voltage is changed when charges are accumulated in a channel bottom of the transistor.

Generally, in a conventional DRAM utilizing a cell transistor and storage capacitor, a complicated process is required to obtain the DRAM. In addition, a high thermal treatment process is performed to improve a characteristic of the transistor. However, the FBC technology does not require the complicated process. Also, the FBC technology facilitates a manufacture of an embedded DRAM including a LOGIC circuit without a capacitor. As a result, various applications are formed with the FBC technology.

However, because the FBC technology requires using a substrate having a floating body, it uses a SOI substrate unlike a conventional DRAM. Based on a 300 mm wafer, the SOI substrate is more expansive than a bulk silicon substrate by three or more times. As a result, the SOI substrate causes an increase in the manufacturing cost of DRAMs.

When the SOI substrate is used in the manufacture of DRAMs, a peripheral circuit has to be formed over the SOI substrate. However, a model parameter of the transistor used in the peripheral circuit can not be used directly in a DRAM technology using the bulk silicon substrate. As a result, the peripheral circuit has been developed under a new SOI circumstance, which results in an increase of a developing period.

BRIEF SUMMARY OF THE INVENTION

Embodiments of the present invention are directed to a semiconductor device. According to an embodiment of the present invention, the semiconductor device includes a bulk-silicon substrate formed in a peripheral region and a SOI substrate for floating body cell devices in a cell/core region. Accordingly, the manufacture cost and developing period of the devices can be reduces.

According to an embodiment of the present invention, a method of fabricating a semiconductor device includes: forming an ion implanted region on a semiconductor substrate in a cell/core region. The semiconductor substrate is selectively etched to form a recess. The recess exposes a boundary of the ion implanted region. The ion implanted region exposed at the bottom of the recess is removed to form an under-cut space in the semiconductor substrate. An insulating film is formed to form a substrate having a silicon-on-insulator (SOI) structure in the cell/core region. The insulating film fills the under-cut space and the recess.

According to another embodiment of the present invention, a method of forming a semiconductor substrate includes: performing an ion implanting process over a substrate in a cell/core region to form an ion implanted region in the substrate in the cell/core region. A portion of the semiconductor substrate located at the boundary of the ion implanted region is selectively etched to form a first recess exposing the ion implanted region. The ion implanted region is removed through the first recess to form an under-cut space in the substrate. A first insulating film is formed to fill the under-cut space and the first recess. A portion of the substrate is selectively etched to form a second recess exposing the first insulating film. A second insulating film is formed to form a SOI structure in the substrate of the cell/core region. The second insulating film fills the second recess.

According to an embodiment of the present invention, a semiconductor device includes: a cell/core region on which a floating body cell (FBC) is to be formed, and a peripheral region having a bulk silicon structure.

BRIEF DESCRIPTION OF THE DRAWINGS

FIGS. 2a to 2k are cross-sectional views illustrating a method of fabricating a semiconductor device according to an embodiment of the present invention.

DESCRIPTION OF EMBODIMENTS

The present invention relates to a semiconductor device. According to an embodiment of the present invention, the semiconductor device includes a substrate having a SOI structure on which a semiconductor memory device such as a floating body cell (FBC) is formed.

Figure 1:
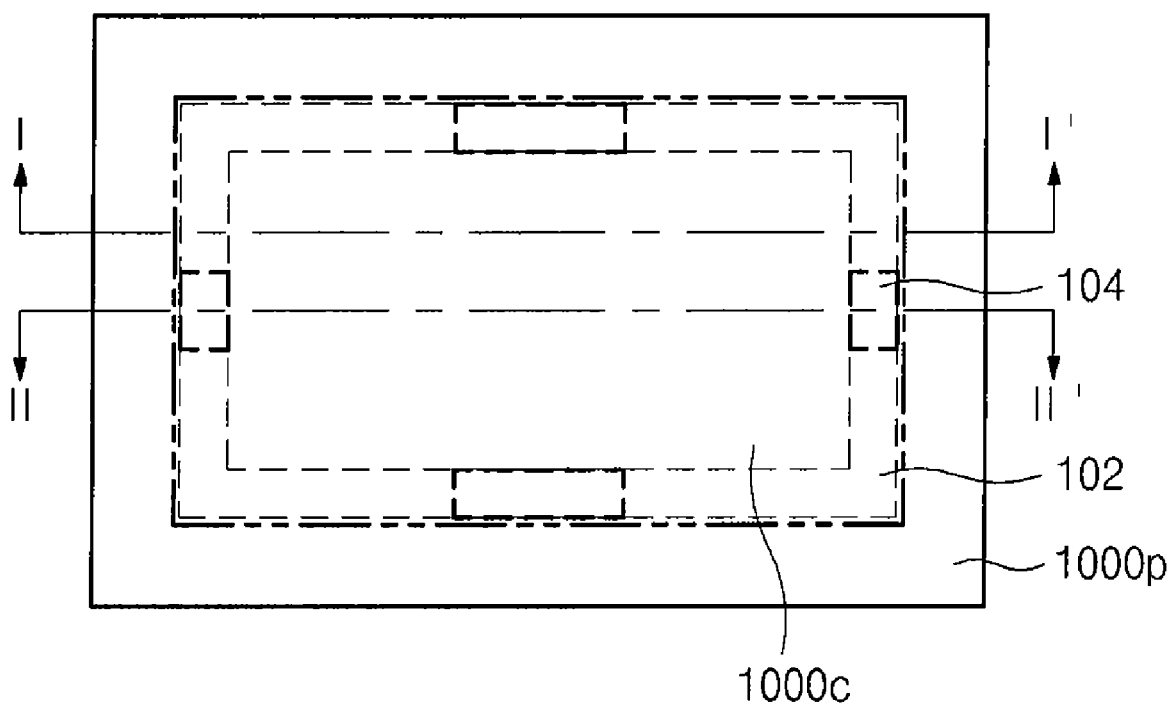
FIG. 1 is a layout of a semiconductor device according to an embodiment of the present invention.

FIG. 1 is a layout of a semiconductor device according to an embodiment of the present invention. The semiconductor device includes a cell/core region 1000c and a peripheral region 1000p. A substrate structure (where a FBC is to be formed) is formed in the cell/core region 1000c. The substrate structure is a SOI structure. The SOI structure is used as an example for embodying a FBC, but other structures may be used.

An under-cut space is formed to obtain the SOI structure in the cell/core region 1000c. The under-cut space may be formed through a recess defined between the cell/core region 1000c and the peripheral region 1000p. The recess is defined by a first recess mask region 102 and a second recess mask region 104. For example, the under-cut space may be formed by first recess mask region 102. While the under-cut space is formed through first recess mask region 102, the semiconductor substrate of second recess mask region 104 is not etched, this will prevent collapse of the semiconductor substrate as a floating body is created in subsequent steps.

Figure 2A:
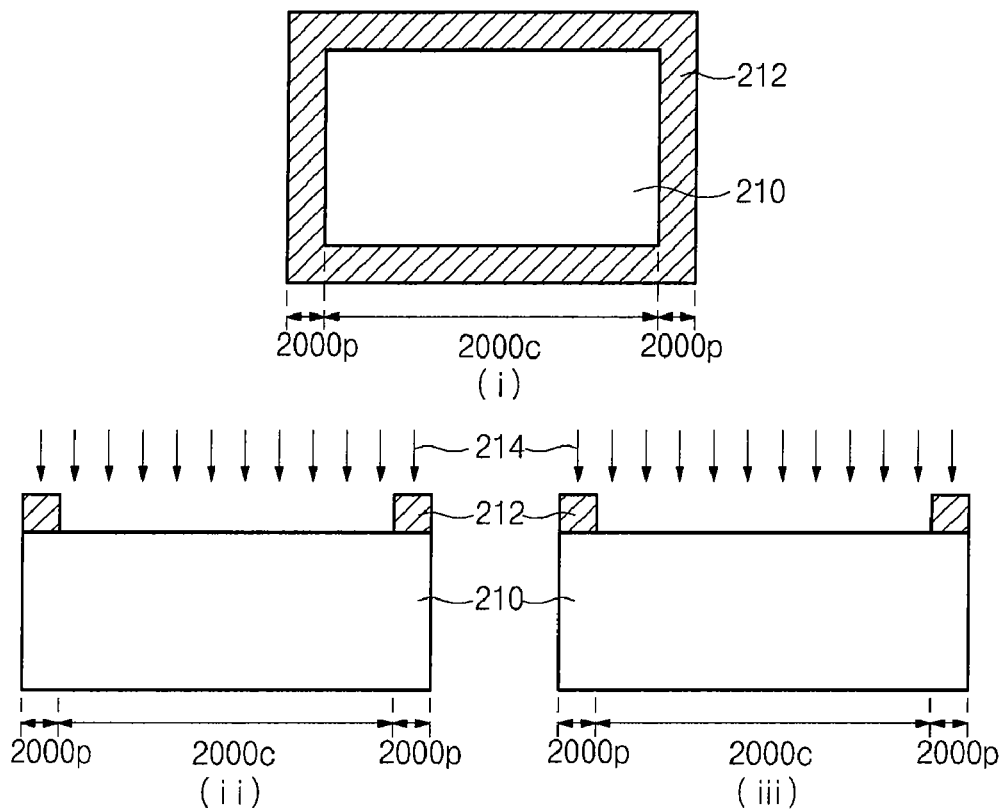

FIGS. 2a to 2k are views illustrating a method of fabricating a semiconductor device according to an embodiment of the present invention. FIGS. 2a(i) to 2k(i) are top-views illustrating a method for fabricating a semiconductor device, FIGS. 2a(ii) to 2k(ii) are cross-sectional views taken along I-I' of FIG. 1, and FIGS. 2a (iii) to 2k(iii) are cross-sectional views taken along II-II' of FIG. 1.

Figure 2B:
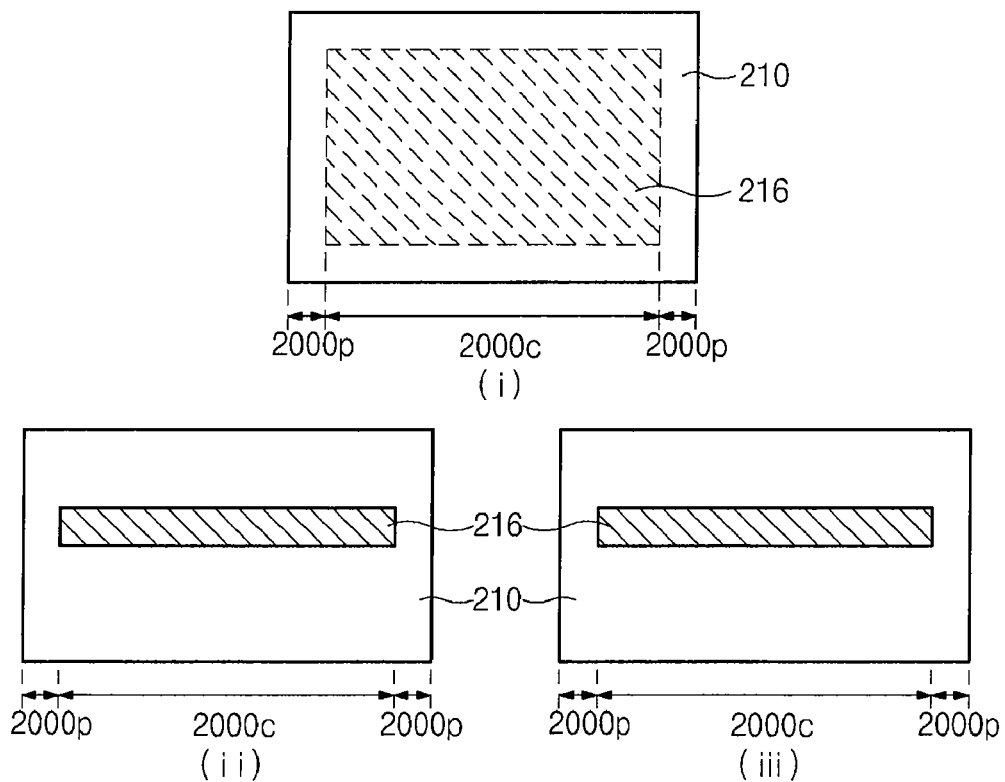

Referring to FIGS. 2a and 2b, a mask layer (not shown) is formed over a semiconductor substrate 210 including a cell/core region 2000c and a peripheral region 2000p. A photo etching process is performed on the mask layer with a mask (not shown) that defines cell/core region 2000c to form a mask pattern 212. An ion-implanting process 214 is performed using hard mask pattern 212 as an ion-implanting mask. Mask pattern 212 is then removed. A thermal treatment process is performed on semiconductor substrate 210 to form an ion-implanting region 216 in semiconductor substrate 210.

An impurity implanted in an ion-implanting process 214 includes Ge. An ion-implanting process 214 is performed under an ion concentration in the range of about 1E5 ions/cm$^2$ to 1E20 ions/cm$^2$ and an energy in the range of 1 KeV to 1,000 KeV. The thermal treatment process is performed to cure semiconductor substrate 210 damaged by an ion-implanting process 214, thereby forming ion-implanting region 215. The thermal treatment process is performed at an atmosphere of nitrogen ($N_2$) or an inert gas during a period of about 1 to 1,800 seconds.

Figure 2C:
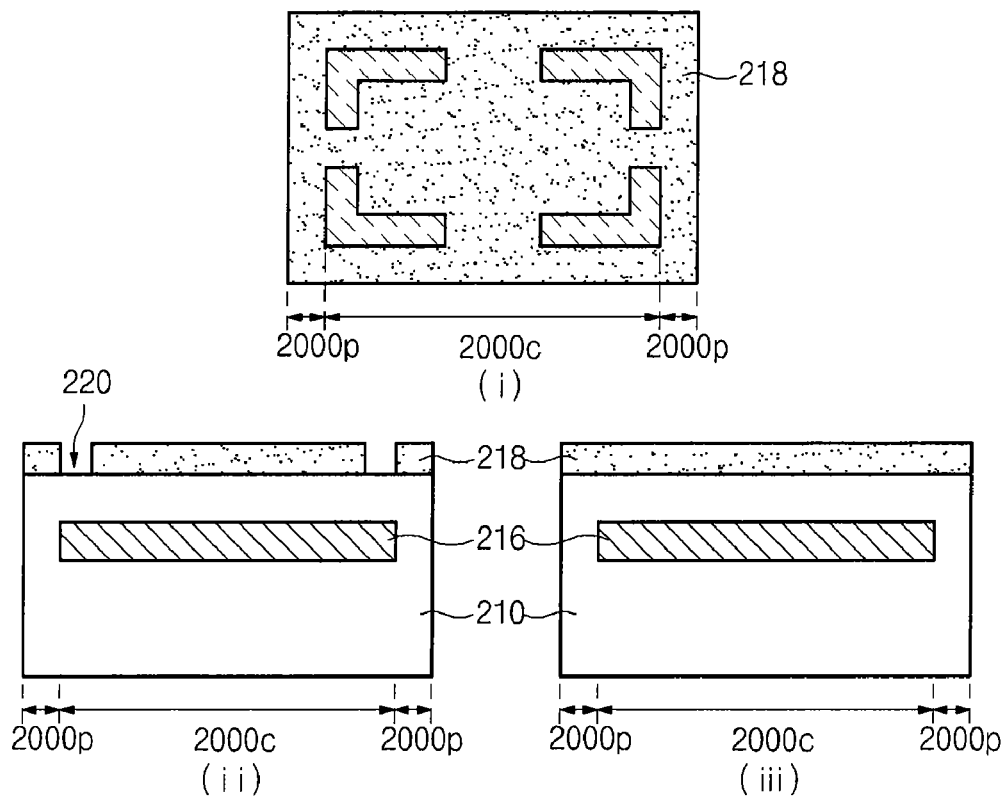
Figure 2D:
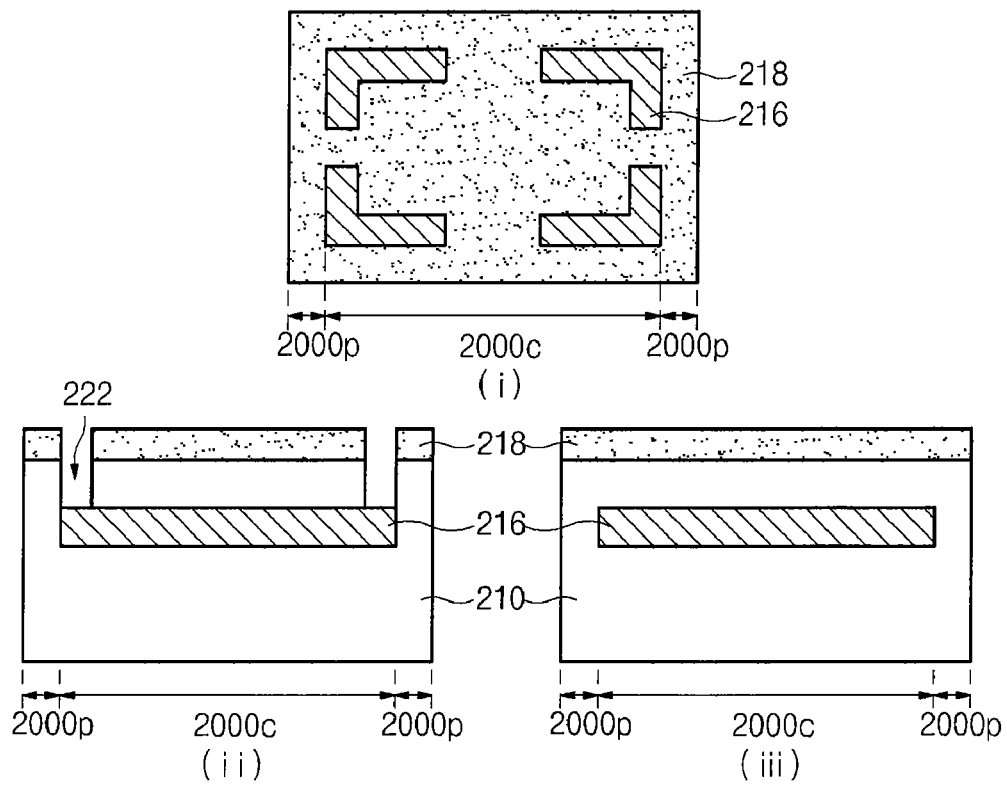

Referring to FIGS. 2c and 2d, a second mask layer (not shown) is formed over semiconductor substrate 210. A second mask layer is patterned by performing a photo etching process with a mask that exposes a portion of semiconductor substrate 210 located in a boundary of cell/core region 2000c and peripheral region 2000p, to form a second mask pattern 218 that exposes first recess region 220. A portion of semiconductor substrate 210 exposed under first recess region 220 is etched using second mask pattern 218 as an etching mask to form a first recess 222 that exposes ion-implanting region 216.

The etching process for forming first recess 222 may be performed until an ingredient of ion-implanting region 216 is detected. In another embodiment of the present invention, first recess 222 can be formed by adjusting an etching time under conditions such as the depth of ion-implanting region 216.

First recess region 220 corresponds to first recess mask 102 of FIG. 1, and includes a portion of the boundary of cell/core region 2000c and peripheral region 2000p. Semiconductor substrate 210 corresponding to second recess mask region 104 of FIG. 1 is not etched to support an upper structure of a subsequent under-cut space in the etching process for forming the under-cut space. First recess region 220 and a second recess region 230 of FIG. 2h prevent collapse of the floating body.

Figure 2E:
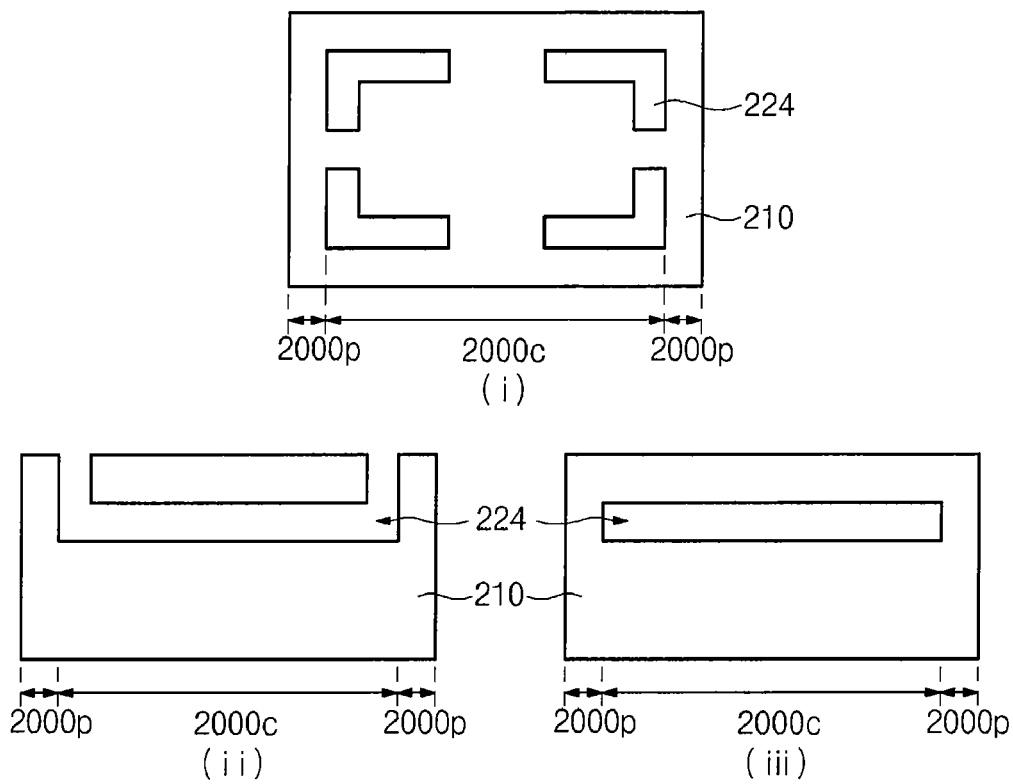
Figure 2F:
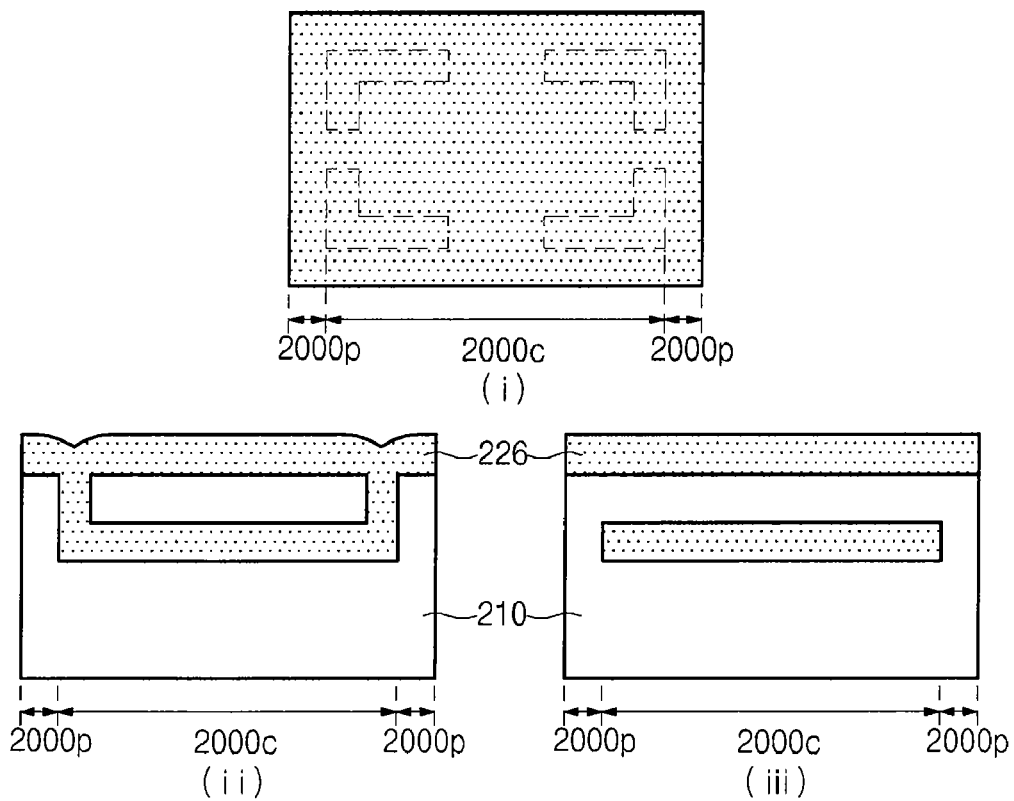
Figure 2G:
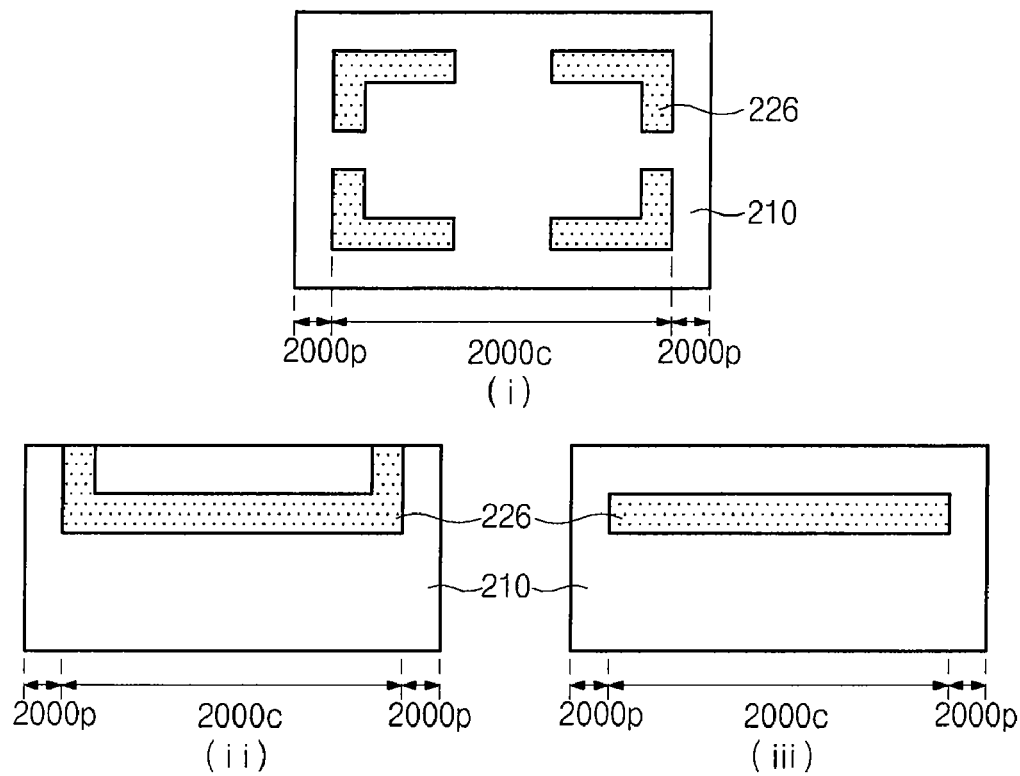
Figure 2H:
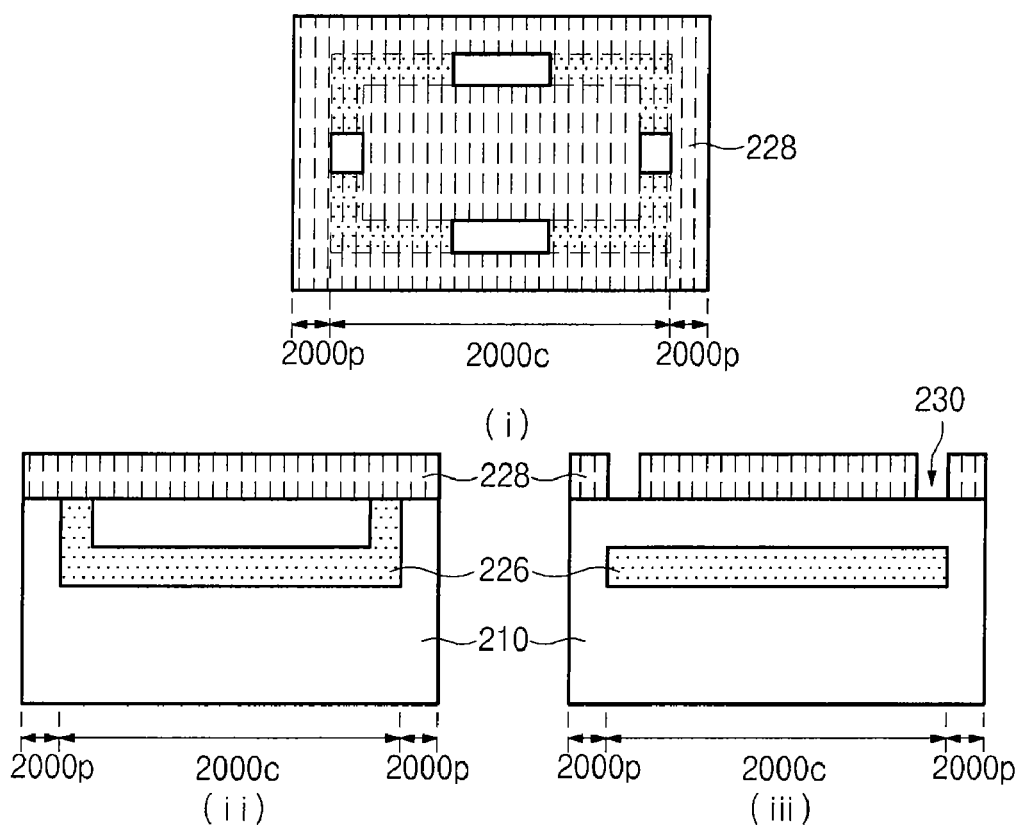

Referring to FIGS. 2e and 2g, ion-implanting region 216 exposed at the bottom of first recess 222 is selectively etched away, thereby forming an under-cut space 224. Second mask pattern 218 is removed to expose semiconductor substrate 210. A first insulating film 226 is formed over semiconductor substrate 210 to fill the first recess 222 and under-cut space 224.

First insulating film 226 includes an oxide film formed with an excellent gap-fill characteristic by one selected from the group consisting of a chemical vapor deposition (CVD) method, a spin-on-dielectric (SOD) method, a spin-on-glass (SOG) method and combinations thereof. First insulating film 226 is planarized until semiconductor substrate 210 is exposed by a chemical mechanical polishing (CMP) method or an etch-back method.

In another embodiment of the present invention, first insulating film 226 includes a stacked structure of a thin thermal oxide film (not shown) and a gap-fill insulating film (not shown). The thin thermal oxide film is formed over first recess 222 and under-cut space 224 by a thermal oxidation method. The gap-fill insulating film is formed over the thin thermal oxide film to fill first recess 222 and under-cut space 224. The gap-fill insulating film is formed by one selected from the group consisting of a CVD method, a SOD method, a SOG method and combinations thereof. The thin thermal oxide film formed in the interface between the gap-fill insulating film and semiconductor substrate 210 improves an interface characteristic.

Referring to FIGS. 2f and 2j, a third mask layer (not shown) is formed over semiconductor substrate 210. Third mask layer is patterned using a mask (not shown) that exposes the boundary of cell/core region 2000c and peripheral region 2000p, thereby forming a third mask pattern 228 that exposes second recess region 230. A portion of semiconductor substrate 210 exposed under second recess region 230 is selectively etched to form a second recess 232 that exposes first insulating film 226. A second insulating film 234 is formed over semiconductor substrate 210 to fill second recess 232. Second insulating film 234 includes the same material as that of first insulating film 226.

Figure 2K:
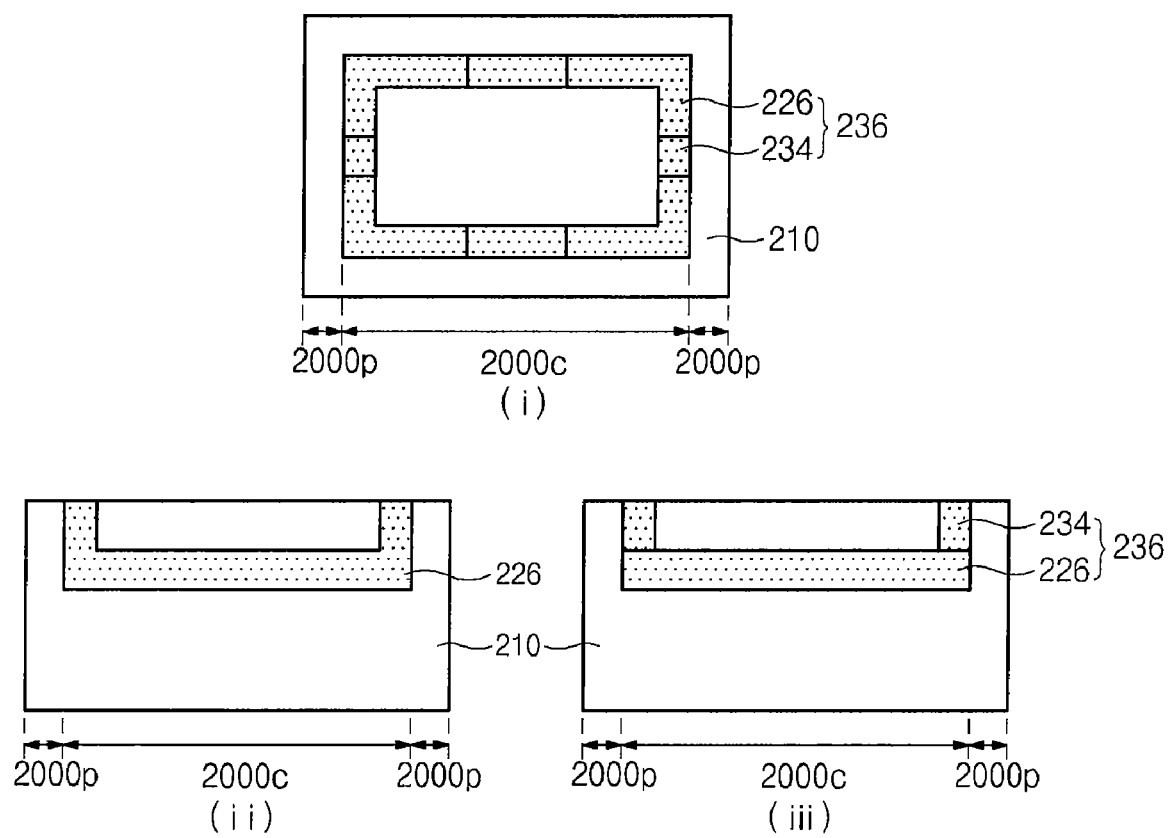

Referring to FIG. 2k, second insulating film 234 and third mask pattern 228 are planarized until semiconductor substrate 110 is exposed. Semiconductor substrate 210 having a SOI structure is formed in cell/core region 2000c. The SOI structure includes a barrier layer 236 defined by first insulating film 226 and second insulating film 234. Cell/core region 2000c is electrically separated from peripheral region 2000p by barrier layer 236. The planarization process is performed by an etch-back method or a CMP method. Subsequent processes may be performed by well known processes such as a process of forming a gate, a process of forming a bit line, and so on.

Figure 3:
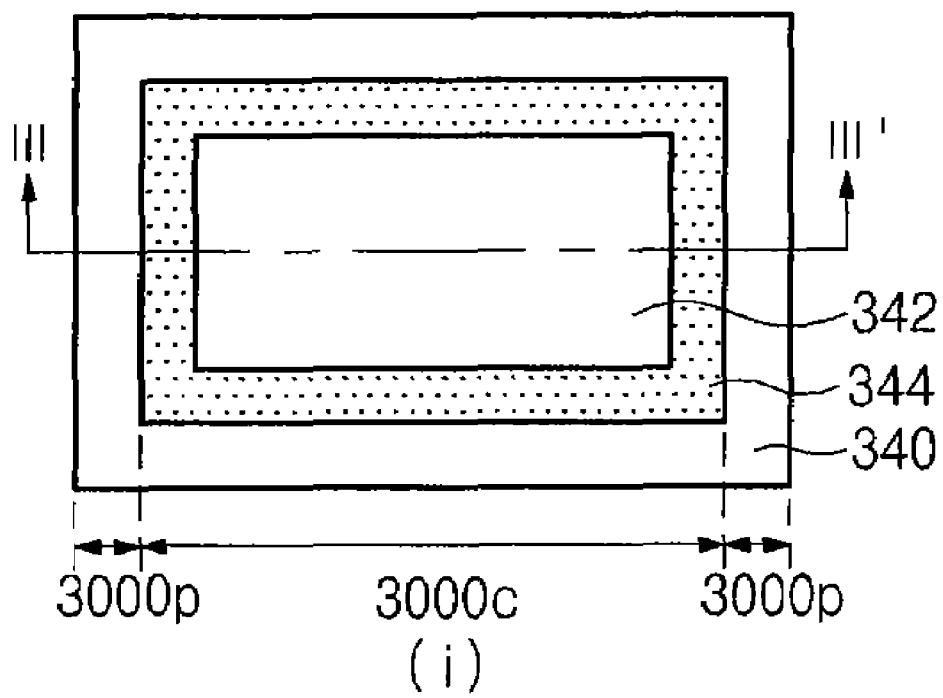
FIG. 3 is a cross-sectional view illustrating a semiconductor device according to an embodiment of the present invention.
Figure 3:
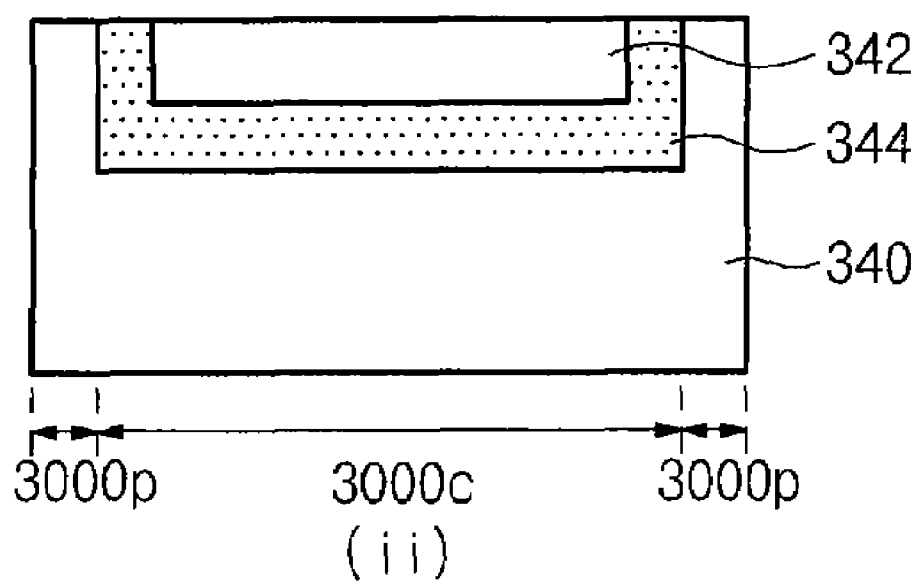

FIG. 3 is a view of a semiconductor device according to an embodiment of the present invention. FIG. 3(i) is a top-view, and FIG. 3(ii) is a cross-sectional view taken along III-III' of FIG. 3(i). The semiconductor device includes a cell/core region 3000c including a substrate structure on which a FBC is to be formed, and a peripheral region 3000p including a bulk silicon structure. The substrate structure on which the FBC is to be formed has a SOI structure. The SOI structure includes a semiconductor substrate 340 that is bulk silicon, a barrier layer 344 for separating cell/core region 3000c electrically from peripheral region 3000p, and a floating body 342. The present invention is illustrative of embodying the SOI structure, and not limited.

As described above, according to an embodiment of the present invention, a semiconductor device has a SOI structure formed in a cell/core region with a bulk silicon substrate to reduce the manufacturing cost. A peripheral region is formed in a bulk silicon substrate to shorten a developing period of the device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:
1. A method of forming a semiconductor substrate, the method comprising:
    performing an ion implanting process over a semiconductor substrate in a cell/core region to form an ion implanted region in the cell/core region;

selectively etching a portion of the semiconductor substrate located at a portion of a boundary of the ion implanted region to form a first recess exposing the ion implanted region;

removing the ion implanted region using the first recess to form an under-cut space in the substrate;

forming a first insulating film to fill the under-cut space and the first recess;

selectively etching a portion of the semiconductor substrate at a portion of a boundary of the first insulating film to form a second recess exposing the first insulating film, wherein the first recess and the second recess are formed in different locations of the semiconductor substrate; and forming a second insulating film to form a SOI structure in the substrate of the cell/core region, the second insulating film filling the second recess, wherein the first insulating film and the second insulating film form a barrier layer that electrically separates a floating body of the SOI structure in the cell/core region from a bulk body in a peripheral region of the semiconductor substrate.

2. The method of claim 1, wherein impurity ions in the ion implanting process comprise germanium (Ge).

3. The method of claim 2, wherein the ion implanting process is performed under an ion concentration in the range of about 1E5 ions/cm$^2$ to 1E20 ions/cm$^2$ and energy in the range of 1 KeV to 1,000 KeV.

4. The method of claim 1, further comprising performing a thermal treatment process on the substrate.

5. The method of claim 4, wherein the thermal treatment process is performed under an atmosphere of nitrogen ($N_2$) or an inert gas for a period of about 1 to about 1,800 seconds.

6. The method of claim 4, wherein the thermal treatment process is performed at a temperature in the range of about 600° C. to about 1,000° C.

7. The method of claim 1, wherein the process of forming the first insulating film comprises:

forming a thermal oxide film over a surface of the first recess and the under-cut space; and forming a third insulating film over the thermal oxide film.

8. The method of claim 7, wherein the third insulating film includes an oxide film formed by a method selected from the group consisting of a chemical vapor deposition (CVD) method, a spin-on-dielectric (SOD) method, a spin-on-glass (SOG) method, and combinations thereof.

* * * * *